United States Patent
Yoshino

(10) Patent No.: US 7,119,525 B1
(45) Date of Patent: Oct. 10, 2006

(54) CONTROL CIRCUIT OF DC—DC CONVERTER AND ITS CONTROL METHOD

(75) Inventor: Takahiro Yoshino, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/281,616

(22) Filed: Nov. 18, 2005

(30) Foreign Application Priority Data

Aug. 29, 2005 (JP) .............................. 2005-247554

(51) Int. Cl.
G05F 1/40 (2006.01)
(52) U.S. Cl. ...................................... 323/283
(58) Field of Classification Search ................ 323/283, 323/282, 224; 700/297
See application file for complete search history.

(56) References Cited

U.S. PATENT DOCUMENTS 6,177,786 B1 * 1/2001 Shimamori .................. 323/283

FOREIGN PATENT DOCUMENTS

| JP | 7-254823 A | 10/1995 |
| JP | 9-154275 A | 6/1997 |
| JP | 10-323026 A | 12/1998 |
| WO | 00/70752 A1 | 11/2000 |

* cited by examiner

*Primary Examiner*—Shawn Riley
(74) *Attorney, Agent, or Firm*—Arent Fox PLLC

(57) ABSTRACT

To present a control circuit of a DC—DC converter to be incorporated in a logic circuit, having a digital error amplifier capable of controlling the gain depending on an input voltage and an output voltage, without requiring a resistance or a capacitor of high precision used in a feedback circuit or the like. A ΣΔ AD converter type error amplifier 10 includes an arithmetic unit 20, an integrating unit 21, a 1-bit quantizing unit 22, a D/A converter 23, and a first counter 24. The arithmetic unit 20 outputs a differential signal of an output voltage Vout and an average output voltage AV. The integrating unit 21 outputs an integral signal by integrating the differential signal. The 1-bit quantizing unit 22 outputs a 1-bit digital signal by quantizing the integral signal. The D/A converter 23 converts from digital to analog depending on a 1-bit digital signal. A digital PWM circuit 11 determines the on-duty of the main switching element of the DC—DC converter depending on the pulse density of the D/A converter 23.

7 Claims, 6 Drawing Sheets

CIRCUIT DIAGRAM OF ΣΔ AD CONVERTER TYPE ERROR AMPLIFIER 10

CIRCUIT DIAGRAM OF ARITHMETIC UNIT 20a OF SWITCHED CAPACITOR TYPE

FIG. 5 CIRCUIT DIAGRAM OF ΣΔ AD CONVERTER TYPE ERROR AMPLIFIER 10b

CIRCUIT DIAGRAM OF DC-DC CONVERTER 100

CONTROL CIRCUIT OF DC—DC CONVERTER AND ITS CONTROL METHOD

CROSS-REFERENCE TO RELATED APPLICATIONS

This application is based upon and claims the benefit of priority from each of the prior Japanese Patent Application No. 2005-247554 filed on Aug. 29, 2005, the entire contents of which are incorporated herein by reference.

BACKGROUND OF THE INVENTION

1. Field of the Invention

The present invention relates to control of a DC—DC converter, and more particularly to a control circuit and its control method of a DC—DC converter which can be composed easily in a logic circuit.

2. Description of the Related Art

In a control circuit for a DC—DC converter of synchronous rectifying switching type having an analog error amplifier, the analog error amplifier has a resistance or a capacitor as a feedback circuit. In the event of fluctuations of an input voltage of a DC—DC converter, or variable control of an output voltage of a DC—DC converter, the error amplifier is required not to oscillate. In order to set a gain to have an allowance in a phase of the feedback circuit, the phase compensation of the feedback circuit must be designed in consideration of the relation of an input and an output voltage at the time of design of the DC—DC converter. That is, it is necessary to control the gain statically.

Other related technologies are disclosed in Japanese unexamined patent application publication No. 9-154275 and Japanese unexamined patent application publication No. 10-323026.

SUMMARY OF THE INVENTION

However, if attempted to set a gain to have an allowance in the phase of a feedback circuit preliminarily, a high precision is required in a resistance or a capacitor used in the feedback circuit or a gain setting. Such a resistance or a capacitor cannot be built in a semiconductor circuit, and a control circuit of a DC—DC converter cannot be incorporated in the logic circuit. As a result, there is a problem in that LSI capable of operating efficiently at an arbitrary supply voltage cannot be constructed.

It is considered to digitize the control circuit of the DC—DC converter in order to eliminate an analog circuit design, a related phase compensation design of the feedback circuit, and a gain compensation design of the error amplifier. However, if the error amplification of an output voltage and a reference voltage of the DC—DC converter is merely digitized, the gain setting in consideration of relation of an input voltage and an output voltage is required. As a result, there are problems in that a large scale circuit is needed for the gain setting or a DSP processing circuit and the circuit scale is increased, or a consumption current is increased.

The present invention is made to solve at least one of the problems of the background art, and it is hence an object thereof to present a control circuit of a DC—DC converter capable of being incorporated in a logic circuit, by having a digital error amplifier capable of controlling the gain depending on an input voltage and output voltage, that is, controlling the gain dynamically, and eliminating a resistance or a capacitor of high precision used in a feedback circuit or a gain setting.

To achieve the object above, there is provided a control circuit of a DC—DC converter of a switching regulator system for generating an output voltage from an input voltage depending on a reference voltage, comprising: an arithmetic unit for outputting a differential signal of the output voltage and a feedback signal; an integrating unit including a differential voltage amplifier for inputting the reference voltage in a non-inverting input and inputting the differential signal in an inverting input, and a capacitor connected to an inverting input terminal of the differential voltage amplifier at one end and connected to an output terminal of the differential voltage amplifier at the other end, for outputting an integral signal by integrating the differential signal; a quantizing unit for outputting a 1-bit digital signal by quantizing the integral signal; a feedback unit for outputting the input signal voltage or a grounding voltage to the arithmetic unit as the feedback signal depending on the input 1-bit digital signal; and a PWM unit for determining an on-duty of a main switching element of the DC—DC converter depending on a pulse density of the quantizing unit.

By an arithmetic unit, an integrating unit, a quantizing unit, and a feedback unit, so-called $\Sigma\Delta$ AD converter is constructed. In the $\Sigma\Delta$ AD converter of the present invention, an output voltage of the DC—DC converter is input to the arithmetic unit of the $\Sigma\Delta$ AD converter, an input voltage of the DC—DC converter is input to the feedback unit, and a reference voltage of the DC—DC converter is input to the non-inverting input of a differential voltage amplifier.

The arithmetic unit outputs a differential signal of an output voltage and a feedback signal. The feedback signal is an analog signal outputs from the feedback unit described below. To calculate a difference, either a current or a voltage may be used.

The integrating unit has a differential voltage amplifier and a capacitor. In the non-inverting input of the differential voltage amplifier, a reference voltage of the DC—DC converter is input, and a differential signal is input to an inverting input. One end of the capacitor is connected to the inverting input terminal of the differential voltage amplifier, and the other end is connected to the output terminal of the differential voltage amplifier. The integrating unit outputs an integral signal by integrating the differential signal.

The quantizing unit quantizes the integral signal, and outputs a 1-bit digital signal. The feedback unit, depending on the input 1-bit digital signal, outputs an input voltage or a grounding voltage to the arithmetic unit as a feedback signal to perform a DA conversion. For example, when a low level signal is input, an input voltage is output, and when a high level signal is input, a grounding voltage is output.

In a PWM unit, a 1-bit digital signal is input. Depending on a pulse density of the quantizing unit (the number of signal pulses of 1 or 0 generated in a specific time), an on-duty of the main switching element of the DC—DC converter is determined.

Hence, when the output voltage and calculation result of an average output voltage output from the feedback unit in the arithmetic unit are both a reference voltage, the $\Sigma\Delta$ AD converter is composed, in which converter the pulse density of 1-bit digital data input in the feedback unit is the AD conversion result. This AD converter acts as a digital error amplifier for amplifying a difference of the output voltage and a reference voltage of the DC—DC converter. Depending on the digital value of the error amplification result output from the digital error amplifier, by the on-duty control of the main switching element in the PWM unit, an output voltage of the DC—DC converter can be regulated to the reference voltage.

By using the input voltage of the DC—DC converter in the feedback unit used in the digital error amplifier, the gain of the digital error amplifier can be controlled depending on the input voltage and the output voltage, that is, the gain can be controlled dynamically. In the digital error amplifier, therefore, the error can be amplified in consideration of not only the relation of the reference voltage and the output voltage, but also the relation of the reference voltage and the input voltage. As a result of the error amplification in the state of the equilibrium (when the output voltage and the average output voltage of the feedback unit are equal, and the input signal level difference of the arithmetic unit is zero), not only the change amount of the on-duty of main switching element is output, but also the actual on-duty can be output.

In the digital error amplifier, hence, it is not necessary to determine the gain of the differential voltage amplifier preliminarily by the relation of the input voltage and the output voltage. As a result, a resistance or a capacitor of high precision used in the feedback circuit or the gain setting is not needed, and the control circuit of the DC—DC converter of the present invention can be built in the logic circuit, so that a logic LSI capable of operating efficiently at an arbitrary supply voltage can be constructed.

Furthermore, a control method of a DC—DC converter of a switching regulator system according to the present invention is a control method of a DC—DC converter of a switching regulator system for generating an output voltage from an input voltage depending on a reference voltage, comprising: a step of outputting a differential signal of the output voltage and the feedback signal; a step of outputting an integral signal by integrating the differential signal; a step of outputting a 1-bit digital signal by quantizing the integral signal; a step of outputting the input voltage or the grounding voltage as the feedback signal depending on the input 1-bit digital signal; and a step of determining the on-duty of the main switching element of the DC—DC converter depending on the pulse density of the feedback signal.

So-called $\Sigma\Delta$ AD converting operation is carried out in the procedure comprising a step of outputting a differential signal of an output voltage and a feedback signal, a step of outputting an integral signal by integrating a differential signal, a step of outputting a 1-bit digital signal by quantizing the integral signal, and a step of outputting an input voltage or a grounding voltage as a feedback signal. By this $\Sigma\Delta$ AD converting operation, the error of the output voltage and the reference voltage of the DC—DC converter is amplified. Depending on the pulse density of the feedback signal as the error amplification result, by the on-duty control of the main switching element, the output voltage of the DC—DC converter can be regulated to the reference voltage.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
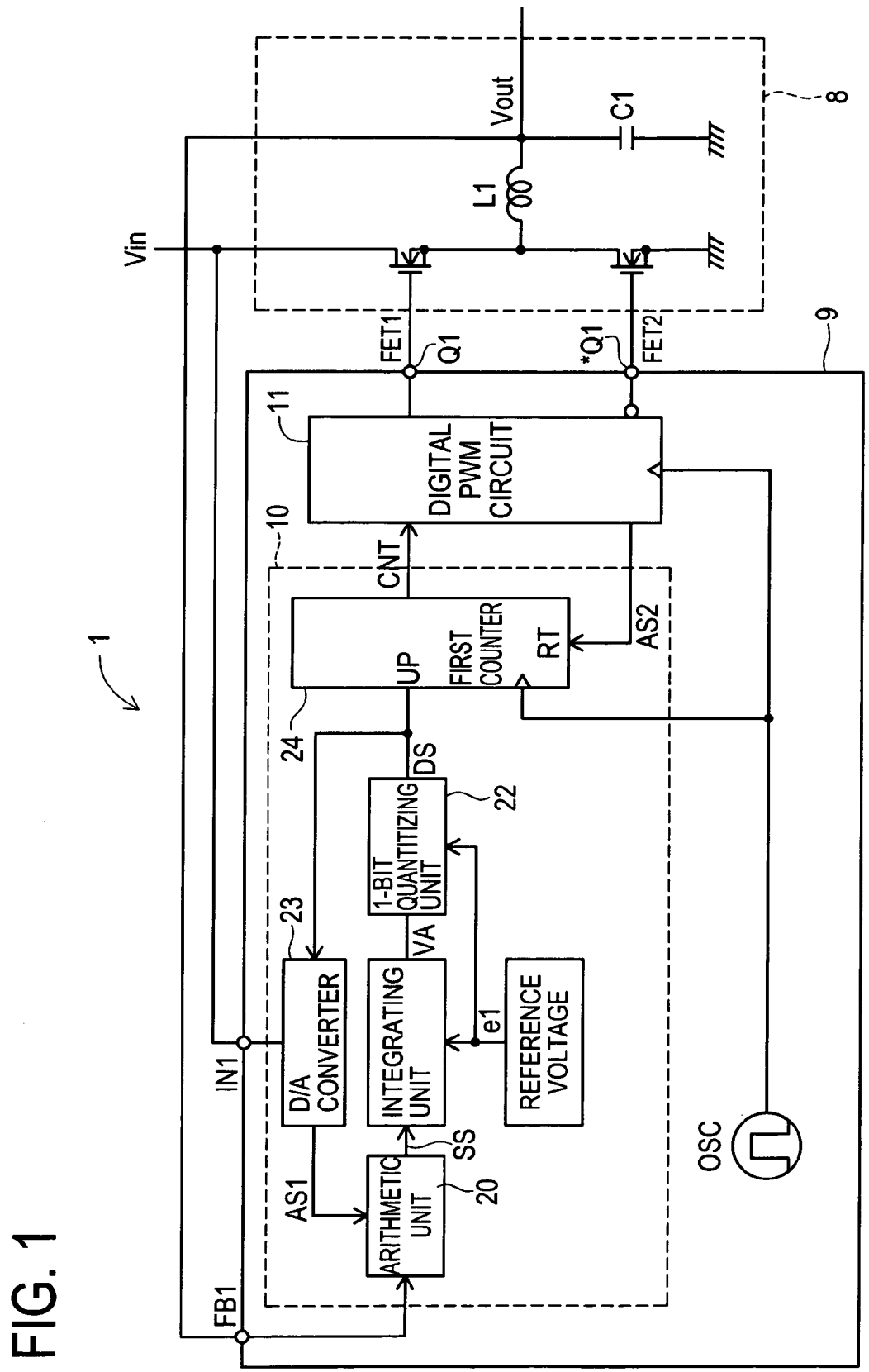
FIG. 1 is a circuit diagram of a DC—DC converter 1.

A specific embodiment of a control circuit of a DC—DC converter having a digital error amplifier of the invention is specifically described below while referring to FIG. 1 to FIG. 6. First, in FIG. 6, a DC—DC converter 100 of a synchronous rectifying switching type having an analog error amplifier is explained. An output voltage Vout of the DC—DC converter is input to a terminal FB1 of a control unit 109. Between the terminal FB1 and a grounding voltage Vss, a resistance R1 and a resistance R2 are connected in series, to divide an output voltage Vout is divided. A reference voltage e1 is input to a non-inverting input of an error amplifier ERA1, and a divided voltage of an output voltage Vout is input to an inverting input. Between the inverting input terminal and an output terminal of the error amplifier ERA1, a resistance R3 and a capacitor C2 are connected as a feedback circuit. A series impedance of the resistance R3 and the capacitor C2 is a feedback resistance Z. An output voltage VE of the error amplifier ERA1 is input to a non-inverting input of a PWM comparator 111. An output voltage VC of a triangular wave oscillator 112 is input to an inverting input of the PWM comparator 111. An output voltage of the triangular wave oscillator 112 is variable between 1.0 V and 2.0 V. The non-inverting output of the PWM comparator 111 is connected to a gate of a main switching transistor FET1 by way of a terminal Q1, and the inverting output is connected to a gate of a synchronous rectifying switching transistor FET2 by way of a terminal *Q1.

Operation is explained. The output voltage Vout is divided by the resistances R1, R2, and a difference of the divided voltage and the reference voltage e1 is amplified by the error amplifier ERA1, and is input the PWM comparator 111. The PWM comparator 111 outputs pulses in a pulse width proportional to the output voltage of the error amplifier ERA1. At this time, generally, the output voltage Vout is given in the following formula (1).

$$Vout = Ton/T \times Vin \qquad \text{formula (1)}$$

Herein, time Ton is a conducting time of the main switching transistor FET1, and time Toff is a non-conducting time of the main switching transistor FET1. Time T is a sum of time Ton and time Toff, and it is the time of one operating period of the DC—DC converter 100.

Thus, in the DC—DC converter 100 of the PWM control system, by controlling the ratio of time Ton and time Toff of the main switching transistor FET1, the output voltage Vout can be regulated to the reference voltage e1.

Necessity of a design of the feedback circuit is explained. For example, when the reference voltage e1 is set at ½ voltage of an input voltage Vin, on-duty of the main switching transistor FET1 is 50%. Hence, the resistances R1, R2 and an impedance of the feedback resistance Z are determined so that the output voltage VE of the error amplifier ERA1 may be 1.5 V, that is, ½ of the output voltage VC of the triangular wave oscillator 112 in the state of equilibrium. Similarly, when the reference voltage e1 is set at ¼ voltage of the input voltage Vin, on-duty of the main switching transistor FET1 is 25%, and hence the resistances R1, R2 and an impedance of the feedback resistance Z are determined so that the output voltage VE may be 1.25 V, that is, ¼ of the output voltage VC in the state of equilibrium.

Thus, the gain of the error amplifier ERA1 must be determined in the relation between the input voltage Vin and the output voltage Vout. At this time, the gain is set in consideration of the relation of an input and an output voltage at the time of the design of the DC—DC converter 100, and the gain must be set to have an allowance in a phase of the feedback circuit preliminarily, so that the error amplifier ERA1 may not oscillate if the output voltage is controlled variably. That is, a static control of the gain is required. Consequently, a high precision is demanded in the resistance R3 and the capacitor C2 used in the feedback circuit or the gain setting, and the resistance R3 and the capacitor C2 cannot be incorporated in the semiconductor circuit.

FIG. 1 is a circuit diagram of the DC—DC converter 1 of the invention. The DC—DC converter 1 comprises a power unit 8 and a control unit 9. The control unit 9 includes a ΣΔ AD converter type error amplifier 10 and a digital PWM circuit 11.

The power unit 8 includes the main switching transistor FET1, the synchronous rectifying switching transistor FET2, a choke coil L1, and a smoothing capacitor C1. The input voltage Vin is connected to an input terminal of the main switching transistor FET1, and an input terminal of the choke coil L1 is connected to an output terminal of the main switching transistor FET1. Between the output terminal and a grounding voltage Vss of the chock coil L1, the smoothing capacitor C1 is provided. From the output terminal of the choke coil L1, the output voltage Vout of the DC—DC converter 1 is output. The output terminal Q1 of the control unit 9 is connected to a control terminal of the main switching transistor FET1. The input terminal of the synchronous rectifying switching transistor FET2 is connected to the ground, and the output terminal is connected to the input terminal of the choke coil L1. The output terminal *Q1 of the control unit 9 is connected to the control terminal of the synchronous rectifying switching transistor FET2. The output voltage Vout of the DC—DC converter 1 is input to the FB1 terminal of the control unit 9.

The control unit 9 includes the ΣΔ AD converter type error amplifier 10, the digital PWM circuit 11, and an oscillator OSC. The ΣΔ AD converter type error amplifier 10 has an arithmetic unit 20, an integrating unit 21, a 1-bit quantizing unit 22, a D/A converter 23, and a first counter 24. The output voltage Vout and an output signal AS1 of the D/A converter 23 are input to the arithmetic unit 20. From the arithmetic unit 20, a signal SS is output as a result of calculation. The signal SS and the reference voltage e1 are input to the integrating unit 21 and an output voltage VA is output. The output voltage VA and the reference voltage e1 are input to the 1-bit quantizing unit 22, and a signal DS is output. The signal DS and the input voltage Vin are input to the D/A converter 23.

Figure 2:
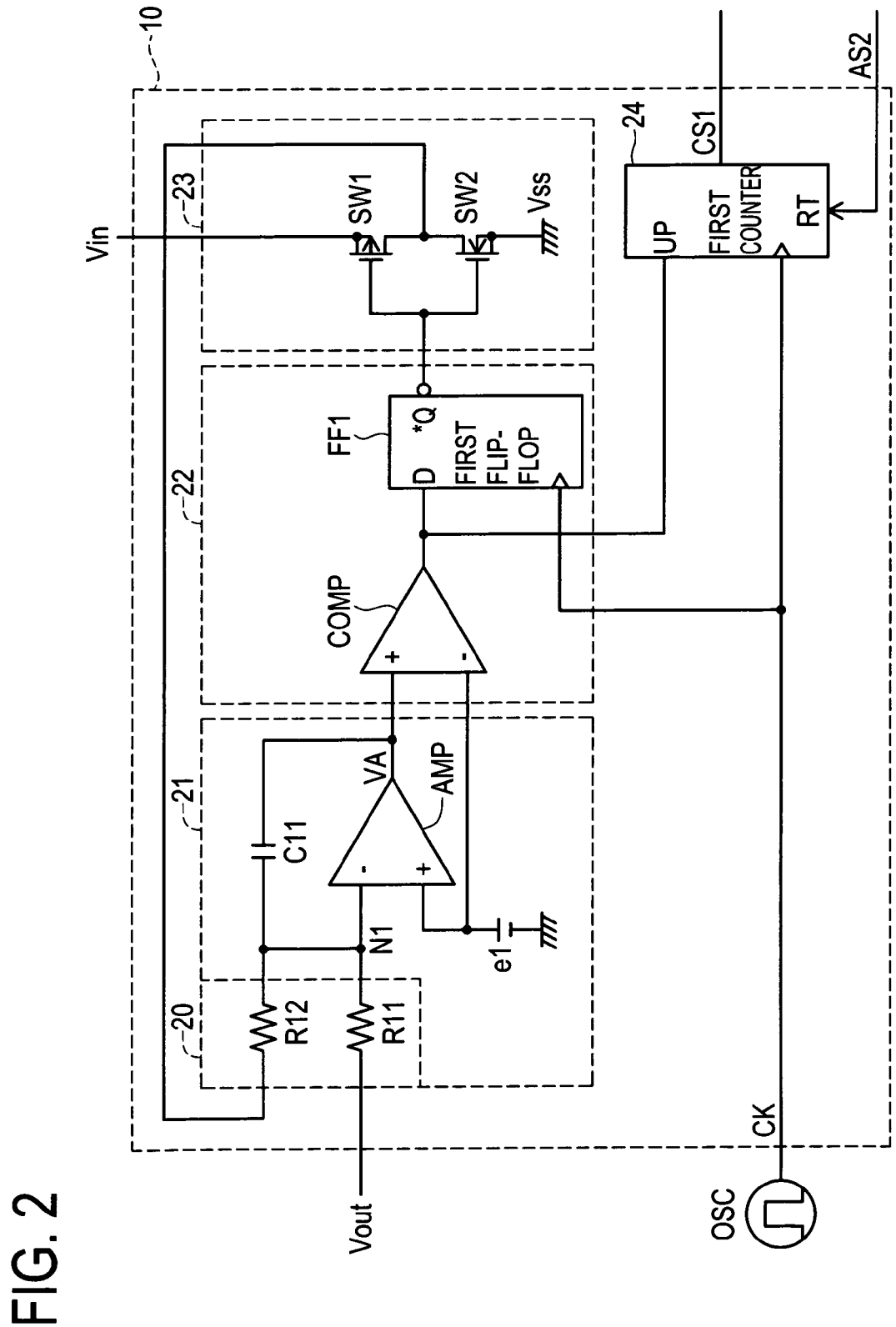
FIG. 2 is a circuit diagram of a $\Sigma\Delta$ converter type error amplifier 10.

A detailed diagram of the ΣΔ AD converter type error amplifier 10 is shown in FIG. 2. The arithmetic unit 20 has the resistances R11 and R12. An input terminal of the resistance R12 is connected to an output terminal of the D/A converter 23. The input terminal of the resistance R11 is connected to a terminal FB1. Output terminals of the resistances R11 and R12 are commonly connected by a node N1, and connected to an inverting input terminal of an operational amplifier AMP and one end of a capacitor C11.

The integrating unit 21 has the operational amplifier AMP and the capacitor C11. The other end of the capacitor C11 is connected to an output terminal of the operational amplifier AMP. The reference voltage e1 is input to the non-inverting input of the operational amplifier AMP.

The 1-bit quantizing unit 22 has a voltage comparator COMP and a first flip-flop FF1. The output voltage VA of the operational amplifier AMP is input to the non-inverting input terminal of the voltage comparator COMP, and the reference voltage e1 is input to the inverting input terminal. An output of the voltage comparator COMP is input to the first flip-flop FF1 and the first counter 24. The output terminal of the voltage comparator COMP is connected to a terminal D of the first flip-flop FF1, and the output terminal of the oscillator OSC is connected to a terminal CLK. An inverting output terminal *Q of the first flip-flop FF1 is connected to the D/A converter 23. The first flip-flop FF1 is a flip-flop of clock synchronous type, and it samples the output of the voltage comparator COMP, and outputs the sampling result in synchronism with a clock signal CK.

The D/A converter 23 has a transistor SW1 of a PMOS transistor, and a transistor SW2 of a NMOS transistor. A source terminal of the transistor SW1 is connected to a terminal IN1 of the control unit 9. An input voltage Vin is input to the source terminal. A source terminal of the transistor SW2 is grounded. A grounding voltage Vss is input to the source terminal. The drain terminals of the transistors SW1 and SW2 are commonly connected, and connected to the resistance R12 of the arithmetic unit 20. The inverting output terminal *Q of the first flip-flop FF1 is connected to the gates of the transistors SW1 and SW2.

The D/A converter 23 is a 1-bit converter for converting 1 or 0 digital data output from a 1-bit quantizing unit 22 into an analog voltage. When digital data 1 is input to the D/A converter 23 from the 1-bit quantizing unit 22, the transistor SW2 conducts, and the D/A converter 23 outputs an analog voltage 0 (V). On the other hand, when a digital data 0 is input from the 1-bit quantizing unit 22, the transistor SW1 conducts, and the D/A converter 23 outputs an input voltage Vin (V) as an analog voltage. As a result, the D/A converter 23, receiving 1-bit digital input, outputs Vin (V) or 0 (V) for one clock period.

The output terminal of the voltage comparator COMP is connected to a terminal UP of the first counter 24, and the output terminal of the oscillator OSC is connected to a terminal CLK. A signal AS2 output from the digital PWM circuit 11 is input to a terminal RT. During one operation period of the DC—DC converter 1, the number of clock cycles of a clock signal CK output from the oscillator OSC is supposed to be a specified clock cycle number n. A value of the specified clock cycle number n is a value determined depending on the duration of one operation period and the resolution of the DC—DC converter 1. A signal AS2 of a high level is input to the terminal RT of the first counter 24 at every specified clock cyclic number n.

The first counter 24 counts the number of times of input of output data '1' of the voltage comparator COMP depending on a clock signal CK. The count number of the first counter 24 is reset to zero at every specified clock cycle number n. At this time, of the specified clock cycle number n, the number of clocks to which data '1' is input is supposed to be a count number m. As described later, the count number m is an AD conversion result of the ΣΔ AD converter type error amplifier 10. The rate of the specified clock cycle number n to count number m (m/n) is supposed to be a pulse density PD. An average output voltage AV output from D/A converter 23 during the specified clock cycle number n is proportional to a pulse density PD, and is expressed in the following formula.

$$AV = V_{in} \times m/n \, [V] \qquad \text{formula (2)}$$

Figure 3:
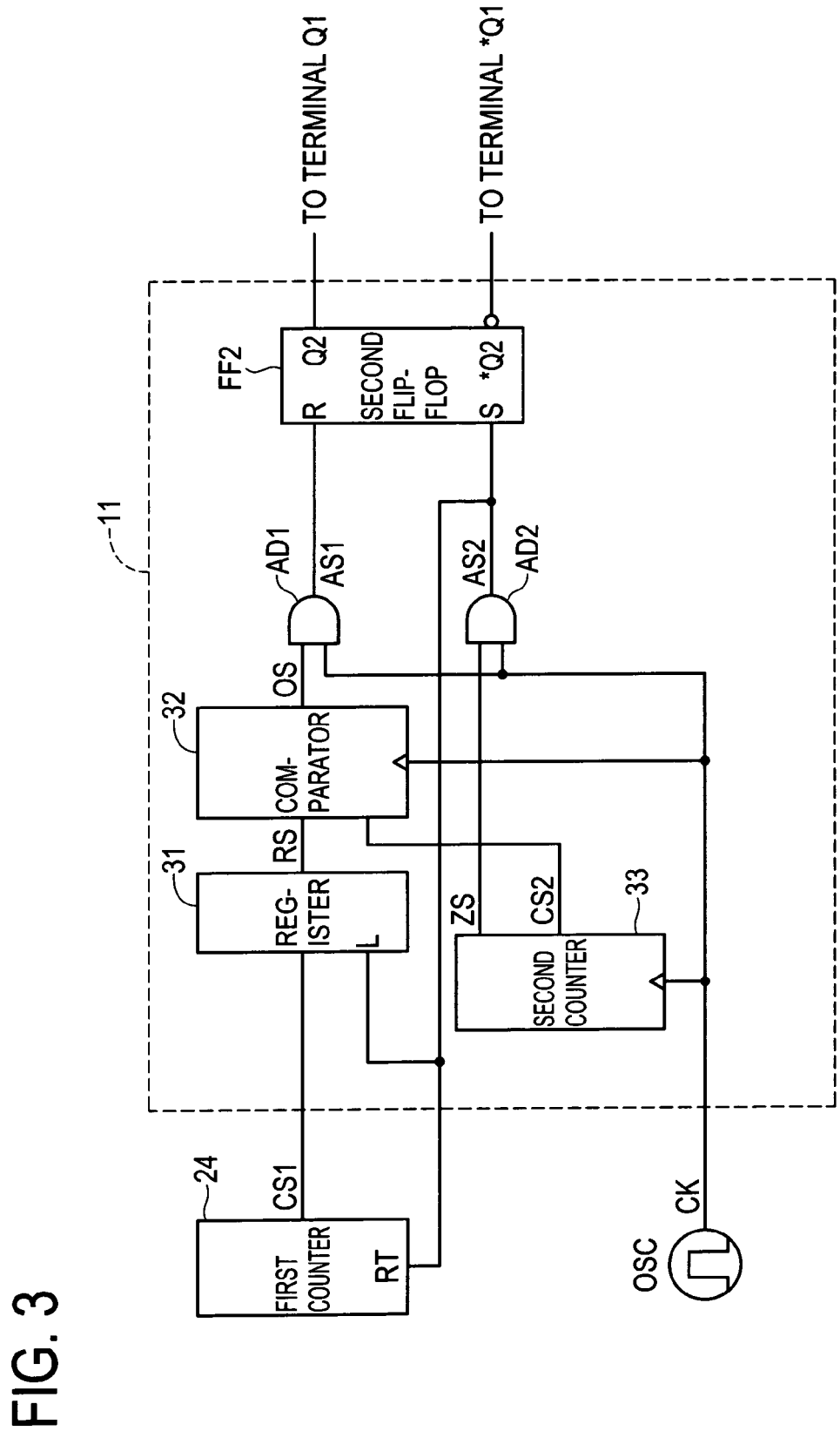
FIG. 3 is a circuit diagram of a digital PWM circuit 11.
Figure 4:
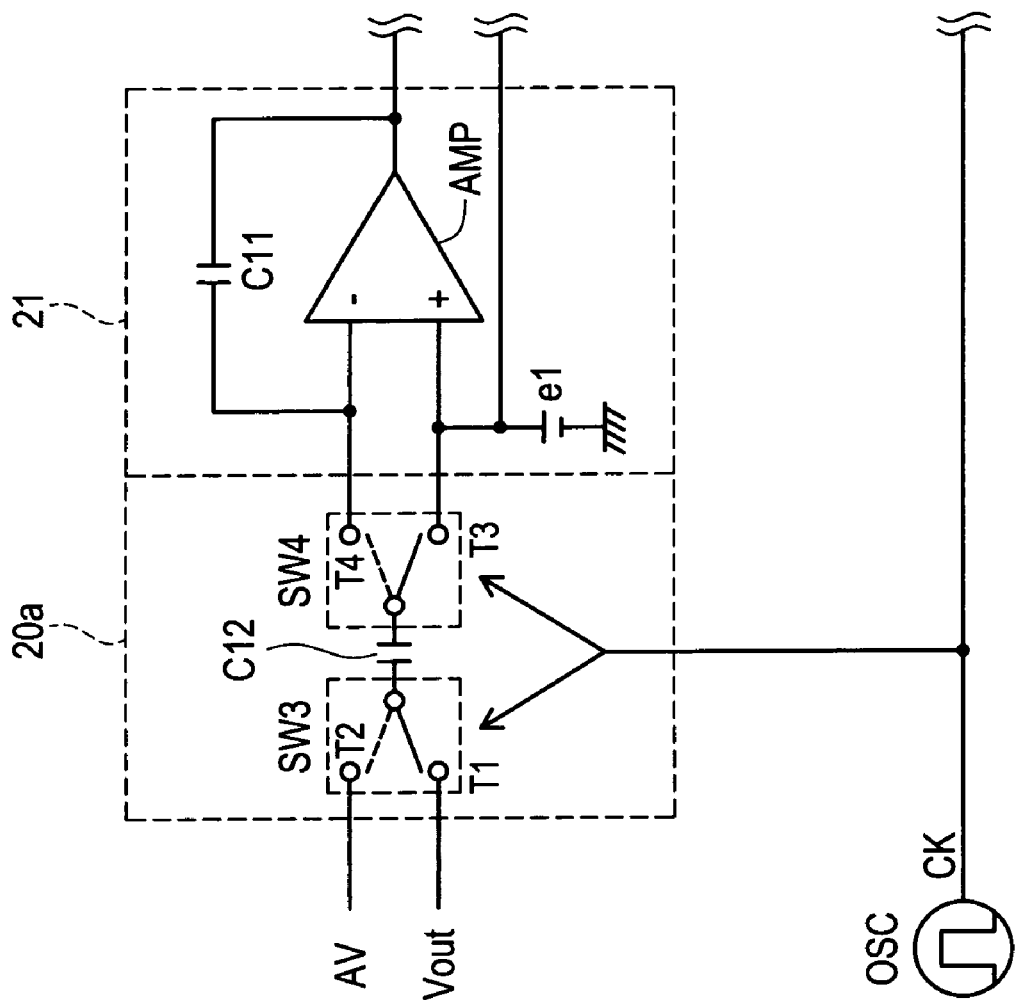
FIG. 4 is a circuit diagram of an arithmetic unit 20a of switched capacitor.

A detailed circuit of the digital PWM circuit 11 is shown in FIG. 3. The digital PWM circuit 11 includes a register 31, a comparator 32, a second counter 33, AND circuits AD1 and AD2, an second flip-flop FF2. The output terminal of the first counter 24 is connected to an input terminal of the register 31, and an output terminal of the AND circuit AD2 is connected to a load terminal L. The output terminal of the oscillator OSC is connected to a clock terminal of the second counter 33. The output terminal of the oscillator OSC is connected to a clock terminal of the comparator 32. An output signal RS from the register 31, and an output signal CS2 from the second counter 33 are input to the comparator 32. An output signal OS and the clock signal CK from the comparator 32 are input to the AND circuit AD1, and a signal AS1 is output. An output signal ZS and the clock signal CK from the second counter 33 are input to the AND circuit AD2, and a signal AS2 is output. The signal AS2 is input to load terminal L of the register 31, a set terminal S of the second flip-flop FF2, and a terminal RT of the first counter 24. The signal AS1 is input to a reset terminal R of the second flip-flop FF2, and the signal AS2 is input to a set terminal S. The non-inverting terminal Q2 of the second flip-flop FF2 is connected to the terminal Q1 of the control unit 9 (FIG. 1), and the inverting output terminal *Q2 is connected to the terminal *Q1 of the control unit 9.

The second counter 33 is a cyclic counter counting from 0 to (n−1) in synchronism with a clock signal CK. The register 31 holds the count number m input as a signal CS1 from the first counter 24. The comparator 32 compares the output signal RS of the register 31 and the output signal CS2 of the second counter 33.

Operation of the DC—DC converter 1 is explained. In the circuit shown in FIG. 2, suppose a state of equilibrium, that is, an output voltage Vout is equal to a reference voltage e1. In the state of equilibrium, the number of times of digital input '1' input in the first counter 24 during a specified clock cycle number n is supposed to be a count number m1. At this time, a pulse density D1 in the state of equilibrium is m1/n. Hence, in the state of equilibrium, an average output voltage AV1 output from D/A converter 23 during the specified clock cycle number n is expressed in the following formula.

$$AV1 = Vin \times m1/n (V) \qquad \text{formula (3)}$$

In the state of equilibrium, an average output voltage AV1 input to the resistance R12 of the integrating unit 21 and an output voltage Vout input to the resistance R11 are both a reference voltage e1.

Next, suppose a state of transition of an output voltage Vout lowering to a voltage ΔV from the state of equilibrium. In the terminal FB1, an output voltage Vout (=e1−ΔV) is applied, and a current flows in the input resistance R11. The current flowing in the resistance R11 does not flow into the inverting input of the operational amplifier AMP, and hence flows from the capacitor C11 to the direction of the resistance R11. As a result, an electric charge is extracted from the capacitor C11, and a potential of a node N1 drops, and an output voltage VA of the operational amplifier AMP elevates. Consequently, an output voltage VA input to the non-inverting input terminal of the voltage comparator COMP is higher than a reference voltage e1, a reference voltage and the voltage comparator COMP output data '1'.

A high level signal '1' output from the voltage comparator COMP is input to the terminal D of the first flip-flop FF1. From the inverting output terminal *Q of the first flip-flop FF1, data '0' is output for one clock cycle period of a clock signal and input to the D/A converter 23, depending on data '1' output from the voltage comparator COMP.

When data '0' is input to the D/A converter 23, the transistor SW1 conducts, and the transistor SW2 does not conduct. Hence, the D/A converter 23 outputs an input voltage Vin (V) depending on a clock signal CK. An input voltage Vin output from the D/A converter 23 is applied to the input terminal of the resistance R12 of the arithmetic unit 20. The DC—DC converter 1 is of a step-down type, and has a relation of |Vin|>=Vout, and hence the amount of the current flowing from the D/A converter 23 to the node N1 by way of the resistance R12 is greater than the current flowing out from the node N1 into the terminal FB1 by way of the resistance R11. As a result, the current flows into the capacitor C11 of the operational amplifier AMP as an integrating unit.

In this way, every time data '0' is output from the inverting output terminal *Q of the first flip-flop FF1 for the duration of one clock cycle period, the current flows into the capacitor C11. When a sufficient charge is accumulated in the capacitor C11, and a voltage at the inverting input terminal of the operational amplifier AMP is higher than a reference voltage e1, an output voltage VA of the operational amplifier AMP declines. As a result, in the voltage comparator COMP, an output voltage VA input to the non-inverting input becomes lower than a reference voltage e1, and the voltage comparator COMP outputs data '0'. From the first flip-flop FF1 to the D/A converter 23, data '1' is output for the duration of one clock cycle period of the clock signal CK depending on an output '0' of the voltage comparator COMP. In the D/A converter 23, the transistor SW2 conducts and the transistor SW1 does not conduct, and an analog voltage 0 (V) is output from the D/A converter 23. Later, returning to the state of equilibrium, the current flowing in the capacitor C11 in a macro state becomes '0'.

When the output voltage Vout is lowered to a voltage ΔV, the count number in the first counter 24 is supposed to be a count number m2. As stated above, the count number m2 is larger than the count number m1 in the state of equilibrium by the count number corresponding to a differential voltage ΔV. Supposing the pulse density at this time to be PD2=(m2/n), a pulse density PD2 is also larger than a pulse density PD1=(m1/n) in the state of equilibrium, depending on a differential voltage ΔV. An average output voltage AV2 output from the D/A converter 23 during a specified clock cycle number n is expressed in the following formula:

$$AV2 = Vin \times m2/n (V) \qquad \text{formula (4)}$$

From the formulas (3) and (4), an average output voltage AV2 is known to be larger than an average output voltage AV1 by the amount depending on a differential voltage ΔV.

The count number m2 is input from the first counter 24 to the register 31 (FIG. 3) of the digital PWM circuit 11 as a signal CS1. The digital PWM circuit 11 controls the on-duty of the main switching transistor FET1 depending on the count number m2, and regulates the output voltage Vout from (reference voltage e1−ΔV) to a reference voltage e1. This regulating operation is explained below.

FIG. 3 specifically shows the digital PWM circuit 11 in FIG. 1. The second counter 33 outputs an output signal ZS of high level in an initial state (count number being 0). When an output signal ZS of high level is input to the AND circuit AD2, the AND circuit AD2 outputs an signal AS2 of high level in synchronism with a clock signal CK. The second flip-flop FF2 transfers to a set state when a signal AS2 of high level is input to the set terminal S, and outputs a high level signal from the non-inverting output terminal Q2. As a result, the main switching transistor FET1 is turned on. The register 31 holds the count number m2 output from the first counter 24 as the signal AS2 of high level is applied to the load terminal L. At the same time, the first counter 24 resets the count number to zero as the signal AS2 of high level is applied to the terminal RT. By the first counter 24 and the register 31, a shift register for operating in every one operation period of the DC—DC converter 1 is constructed.

The comparator 32 compares an output signal RS of the register 31 and an output signal CS2 of the second counter 33. While the count number (output signal CS2) of the second counter 33 which is a cyclic counter is smaller than a count number m2 (output signal RS) of the first counter 24, the comparator 32 outputs an output signal OS of low level. As a result, an output signal AS1 of the AND circuit AD1 is maintained at low level, and the second flip-flop FF2 is maintained in a set state. Depending on a clock signal CK, the main switching transistor FET1 is turned on, and energy is accumulated in the choke coil L1.

As the clock advances, when the count number (output signal CS2) of the second counter 33 becomes larger than the count number m2 (output signal RS) of the first counter 24, the comparator 32 outputs an output signal OS of high level. Consequently the AND circuit AD1 outputs an output signal AS1 of high level depending on a clock signal CK of high level. As a result, the second flip-flop FF2 is reset, and a low level signal is output from the non-inverting output terminal Q2. The main switching transistor FET1 is turned off, and the synchronous rectifying switching transistor FET2 is turned on depending on a clock signal CK, so that energy is released from the choke coil L1. As the clock further advances, the second counter 33 which is a cyclic counter returns to an initial state (count number 0). Thereafter, this operation is repeated.

By the above operation, the digital PWM circuit 11 turns on the main switching transistor FET1 for the duration of the count number m2 during a specified clock cycle number n. That is, the digital PWM circuit 11 determines the on-duty of the main switching transistor FET1 depending on a pulse density PD2 (m2/n).

Consequently, when an output voltage Vout drops from a reference voltage e1 to (a reference voltage e1–ΔV), the integrating unit 21 amplifies the error of a voltage ΔV. The count number of the first counter 24 increases from a count number m1 to m2 depending on a voltage ΔV. The on-duty of the main switching transistor FET1 elevates from (m1/n) to (m2/n) depending on a voltage ΔV. As a result, an output voltage Vout is regulated to elevate from (a reference voltage e1–ΔV) to a reference voltage e1.

Suppose an output voltage Vout of the DC—DC converter 1 is regulated to a reference voltage e1 to reach the state of equilibrium. Herein, the state of equilibrium means the equilibrium in a macro state in an actual operation. The equilibrium in the macro state is a state in which the time average value of an output voltage Vout and an average output voltage AV are equal to an reference voltage e1, and the current flowing in the capacitor C11 of the integrating unit 21 is zero. In the micro state, on the other hand, in the capacitor C11, the current is flowing in and flowing out in every clock cycle, and the voltage comparator COMP is outputting data '1' or '0' in every clock signal CK.

In the state of equilibrium, an output voltage Vout input in the ΣΔ AD converter type error amplifier 10 is equal to an average output voltage AV, and the error is zero. In this state of equilibrium, the number of times of input of '1' in the first counter 24 during a specified clock cycle number n is supposed to be a count number m1. At this time, since an average output voltage AV is equal to a reference voltage e1, a count number m1 is expressed in the following formula (5).

$$m1 = e1 \times n / Vin \qquad \text{formula (5)}$$

That is, the ΣΔ AD converter type error amplifier 10 is characterized by outputting a count number m1 of a specified value expressed in the formula (5) even when the error is zero.

A count number m1 is input to the digital PWM circuit 11 by way of the first counter 24. In the digital PWM circuit 11, while the count number (output signal CS2) of the second counter 33 which is a cyclic counter is smaller than the count number m1 (output signal RS) of the first counter 24, the comparator 32 outputs an output signal OS of low level. As a result, depending on a clock signal CK, the main switching transistor FET1 is turned on. As the clock advances, when the count number (output signal CS2) of the second counter 33 becomes larger than the count number m2 (output signal RS) of the first counter 24, the comparator 32 outputs an output signal OS of high level. Consequently the AND circuit AD1 outputs an output signal AS1 of high level, the second flip-flop FF2 is reset, and the main switching transistor FET1 is turned off.

By the above operation, the digital PWM circuit 11 turns on the main switching transistor FET1 only for the duration of the count number m1 during a specified clock cyclic number n. That is, the digital PWM circuit 1 determines the on-duty of the main switching transistor FET1 depending on a pulse density PD1 (m1/n), and thereby maintains an output voltage Vout of the DC—DC converter at a reference voltage e1.

As explained above, according to the control circuit of the DC—DC converter of the embodiment, in the ΣΔ AD converter composed of the integrating unit 21, the 1-bit quantizing unit 22, and the D/A converter 23, an output voltage Vout is input as an input analog signal of the integrating unit 21, a reference voltage e1 is used as a reference voltage for the operational amplifier AMP, and an input voltage Vin is input to the D/A converter 23. Accordingly, the ΣΔ AD converter type error amplifier 10 outputs the error amplification result of an output voltage Vout input to the terminal FB1 and an average output voltage AV outputs from the D/A converter 23, as a pulse density (the number of signal pulses of 1 or 0 generated in a specific period) input to the D/A converter 23. Depending on the digital value of the error amplification result output from the ΣΔ AD converter type error amplifier 10, the on-duty of the main switching transistor FET1 is controlled, so that the output voltage Vout of the DC—DC converter is regulated to a reference voltage e1. Hence, by using the ΣΔ AD converter type error amplifier 10, a control circuit of the switching regulator type DC—DC converter for generating an output voltage Vout from an input voltage Vin depending on a reference voltage e1 can be constructed.

Moreover, by using an input voltage Vin of the DC—DC converter as a reference voltage of the D/A converter 23 applied in the ΣΔ AD converter type error amplifier 10, the gain of the ΣΔ AD converter type error amplifier 10 can be controlled depending on an input voltage Vin and an output voltage Vout, that is, the gain can be controlled dynamically. In the ΣΔ AD converter type error amplifier 10, the error is amplified in consideration of not only the relation of a reference voltage e1 and an output voltage Vout, but also the relation of a reference voltage e1 and an input voltage Vin. Accordingly, as the error amplification result in the state of equilibrium (an output voltage Vout is equal to an average output voltage AV of the D/A converter 23, and an input signal level of an integrating unit 21 is zero), not only the change amount of the on-duty ((m2–m1)/n) of the main switching transistor FET1 is output, but also the actual on-duty m1/n can be output.

Figure 6:
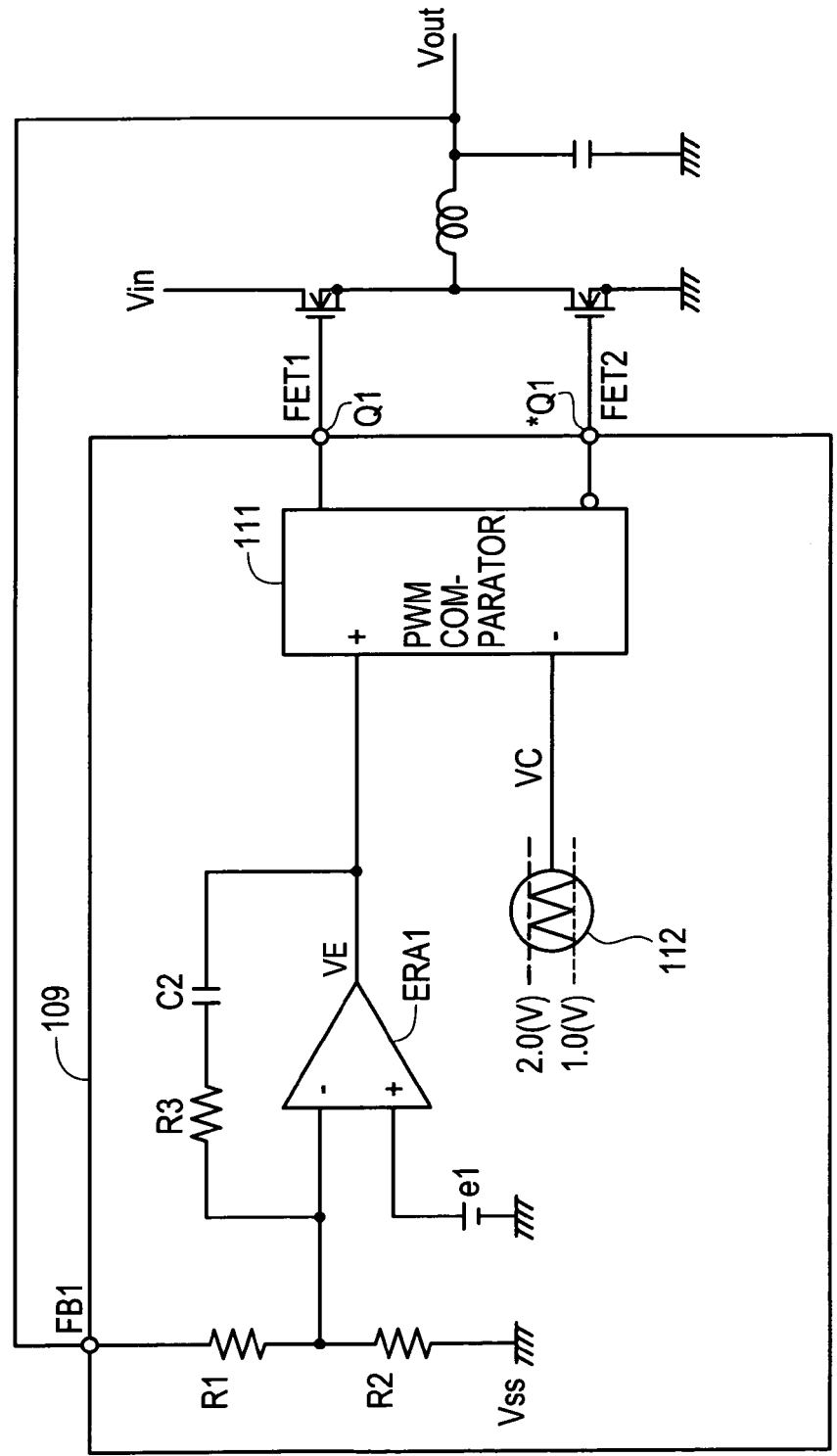
FIG. 6 is a circuit diagram of a DC—DC converter 100.

As a result, in the ΣΔ AD converter type error amplifier 10, it is not necessary to determine the gain of the operational amplifier AMP preliminarily by the relation of an input voltage Vin and an output voltage Vout. Hence, the feedback circuit such as the capacitor C2 or the resistance R3 in the DC—DC converter 100 in FIG. 6 is not needed. As a result, a resistance or a capacitor of high precision used in the feedback circuit or the gain setting can be eliminated, and the control circuit of the DC—DC converter can be incorporated in the logic circuit. Therefore, a logic LSI capable of operating efficiently at arbitrary supply voltage can be realized.

When constructing a digital error amplifier, complicated circuits for processing equivalent to feedback circuits used in a conventional analog error amplifier are not needed, and the control circuit of the DC—DC converter is simplified, so that the cost can be saved.

The ΣΔ AD converter type error amplifier 10 of the present invention does not require a feedback circuit or a gain setting circuit using a resistance or a capacitor of high precision. The resistances R11 and R12 for constructing the arithmetic unit 20 are required to be satisfactory in a relative precision, but an absolute precision is not demanded. The capacitor C11 is an element for detecting the flowing direction of the current, so that precision is not required. Hence, in the ΣΔ AD converter type error amplifier 10, a digital error amplification of high precision is realized without demanding high analog precision in individual constituent elements. It hence contributes to the enhancement of production yield of the DC—DC converter control circuit having the ΣΔ AD converter type error amplifier 10.

The invention is not limited to the above embodiment, but may be modified or embodied in several forms without departing from the true spirit of the essential characteristics thereof. In the arithmetic unit 20 shown in FIG. 2, an adder is composed of the resistances R11 and R12. An output voltage Vout and an average output voltage AV of the D/A converter 23 are calculated after a voltage-current conversion, but the present invention is not limited to this example. For example, as in an arithmetic unit 20a of a switched capacitor type shown in FIG. 4, a capacitor C12 may be provided instead of the resistances R11 and R12.

The arithmetic unit 20a has switches SW3 and SW4. The switch SW3 has terminals T1 and T2. An output voltage Vout is input to the terminal T1, and an average output voltage AV is input to the terminal T2. The switch SW4 has terminals T3 and T4. The terminal T3 is connected to the non-inverting input terminal of the operational amplifier AMP, and the terminal T4 is connected to the inverting input terminal. The switches SW3 and SW4 alternately repeat the states of selecting the terminals T1 and T3 and selecting the terminals T2 and T4, depending on a clock signal CK.

When the terminals T1 and T3 are selected, a differential voltage of an output voltage Vout and a reference voltage e1 is accumulated in the capacitor C12. Later, when the terminals T2 and T4 are selected, an average output voltage AV of the D/A converter 23 is accumulated in the capacitor C12, and the adder is put in operation. A voltage of the capacitor C12 changes the output of the operational amplifier AMP which is an integrating unit by way of the capacitor C11. As explained above, the ΣΔ AD converter type error amplifier 10 of the present invention can be constructed also by using the arithmetic unit 20a of a switched capacitor type.

Figure 5:
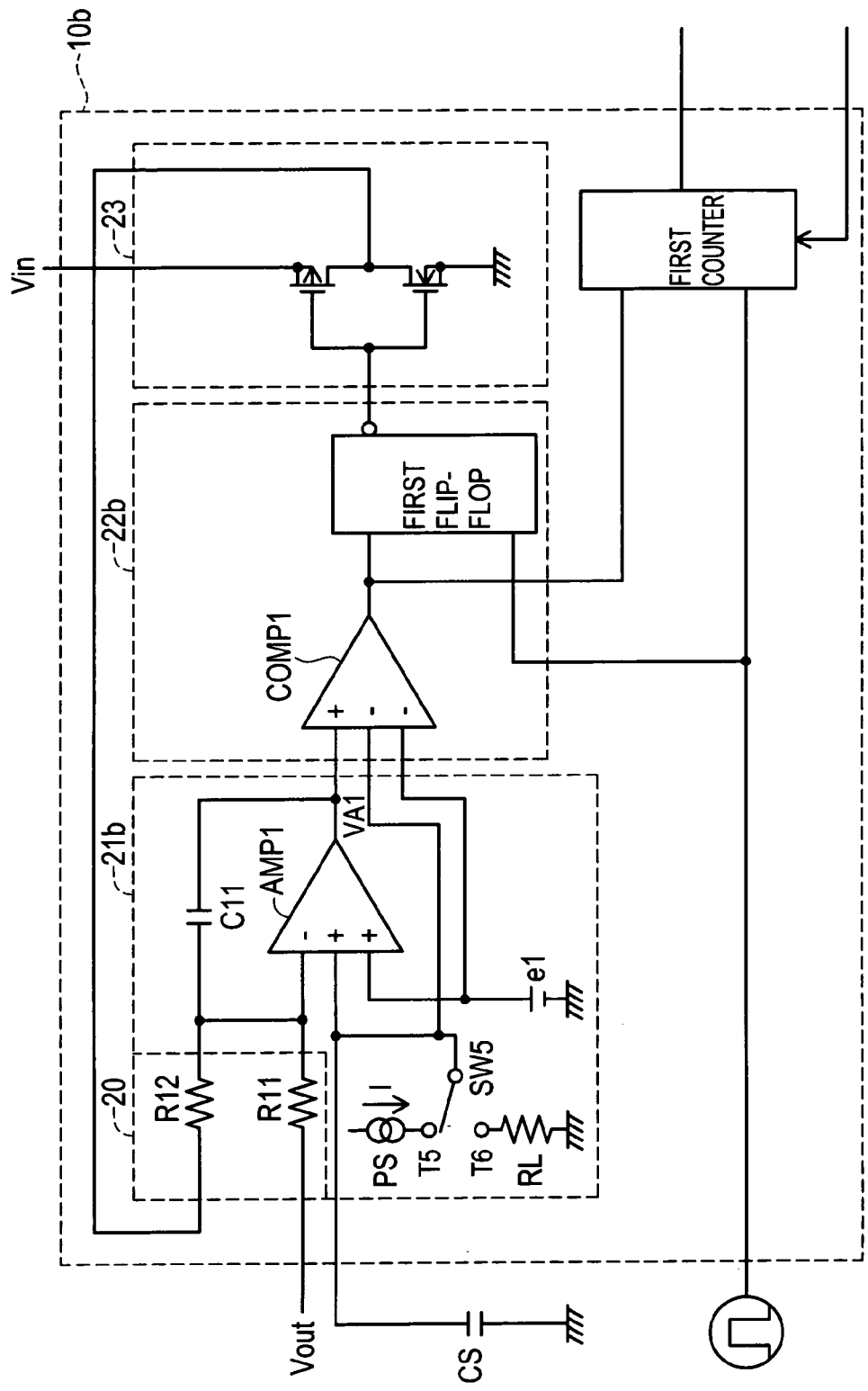
FIG. 5 is a circuit diagram of a $\Sigma\Delta$ converter type error amplifier 10b.

FIG. 5 shows a ΣΔ AD converter type error amplifier 10b capable of controlling the output voltage ramp slope when starting or stopping the DC—DC converter. The ΣΔ AD converter type error amplifier 10b includes an integrating unit 21b and a 1-bit quantizing unit 22b. The integrating unit 21b includes an operational amplifier AMP1 having a first and a second non-inverting input terminals. The first non-inverting input terminal of the operational amplifier AMP1 is connected to a switch SW5, and is grounded through a capacitor CS connected as an external element. The switch SW5 has the capacitor CS connected to either a terminal T5 or T6. A current source PS for supplying the constant current I is connected to the terminal T5. The terminal T6 is grounded through a resistance RL. A reference voltage e1 is input to the second non-inverting input terminal.

The operational amplifier AMP1 outputs an output voltage depending on a potential difference of an input voltage of lower level of the input voltages to the first and second non-inverting input terminals, and an input voltage of the inverting input terminal.

The 1-bit quantizing unit 22b includes the voltage comparator COMP1 having the first and second inverting input terminals. The first inverting input terminal of the voltage comparator COMP1 is connected to the switch SW5 and the capacitor CS. A reference voltage e1 is input to the second inverting input terminal. The voltage comparator COMP1 compares the input voltage of lower level of the input voltages to the first and second inverting input terminals with the input voltage of the non-inverting input terminal. Other configurations are the same as in the ΣΔ AD converter type error amplifier 10 shown in FIG. 2, and a detailed description is omitted herein.

The following is the explanation of a starting operation of the DC—DC converter mounting the EA AD converter type error amplifier 10b. As the DC—DC converter starts, the switch SW5 connects the current source PS to the capacitor CS. Consequently, by the time constant of the current source PS and the capacitor CS, an output voltage level of the capacitor CS elevates gradually. While the output voltage level of the capacitor CS is lower than a reference voltage e1, the operational amplifier AMP1 operates on the basis of comparison of an output voltage Vout and an output voltage of the capacitor CS, and the voltage comparator COMP1 operates on the basis of comparison between the output voltage VA1 of the operational amplifier AMP1 and the output voltage of the capacitor CS. The voltage comparator COMP1 outputs a high level signal '1' when the output voltage VA1 input in the non-inverting input terminal is higher than the output voltage of the capacitor CS. Along with elevation of the output voltage level of the capacitor CS, the count number m and the pulse density PD increase gradually, and the on-duty of the main switching transistor FET1 also rises gradually along with elevation of the output voltage level of the capacitor CS. As a result, the on-duty of the main switching transistor FET1 is not increased excessively, and it is known that the output voltage Vout of the DC—DC converter can be controlled variably. Hence, by using the ΣΔ AD converter type error amplifier of the present invention, an output voltage ramp slope control can be realized.

The D/A converter 23 is an example of the feedback circuit, the resistance R11 is an example of the first resistance element, and the resistance R12 is an example of the second resistance element.

According to the present invention, as described herein, in the DC—DC converter of the switching regulator system, by using the ΣΔ AD converter as a digital error amplifier for amplifying the difference of an output voltage of the DC—DC converter and a reference voltage, and controlling the on-duty of the main switching element depending on the digital value as an error amplification result output from the ΣΔ AD converter, the output voltage of the DC—DC converter can be regulated to a reference voltage. Moreover, by using the input voltage of the DC—DC converter in the feedback unit used in the digital error amplifier, the gain of the digital error amplifier can be controlled depending on an input voltage and an output voltage, that is, the gain can be controlled dynamically. As a result, a resistance or a capacitor of high precision used in the feedback circuit or the gain setting is not required, so that a control circuit of the DC—DC converter incorporated in a logic circuit can be presented.

What is claimed is:

1. A control circuit of a DC—DC converter of a switching regulator system for generating an output voltage from an input voltage depending on a reference voltage, comprising:
   an arithmetic unit for outputting a differential signal of the output voltage and a feedback signal;
   an integrating unit including a differential voltage amplifier for inputting the reference voltage in a non-inverting input and inputting the differential signal in an inverting input, and a capacitor connected to an inverting input terminal of the differential voltage amplifier at one end and connected to an output terminal of the differential voltage amplifier at the other end, for outputting an integral signal by integrating the differential signal;
   a quantizing unit for outputting a 1-bit digital signal by quantizing the integral signal;
   a feedback unit for outputting the input signal voltage or a grounding voltage to the arithmetic unit as the feedback signal depending on the input 1-bit digital signal; and
   a PWM unit for determining an on-duty of a main switching element of the DC—DC converter depending on a pulse density of the quantizing unit.

2. The control circuit of the DC—DC converter of the switching regulator system according to claim 1,
   wherein the arithmetic unit includes a first resistance element connected between an input terminal of the output voltage and an input terminal of the integrating unit, and a second resistance element connected between an output terminal of the D/A converter and an input terminal of the integrating unit.

3. The control circuit of the DC—DC converter of the switching regulator system according to claim 1,
   wherein the quantizing unit includes a comparator for comparing a magnitude of the integral signal and the reference voltage, and a flip-flop for inputting an output of the comparator and a clock signal and inputting the output signal of the comparator to the feedback unit in synchronism with the clock signal.

4. The control circuit of the DC—DC converter of the switching regulator system according to claim 1,
   wherein the quantizing unit outputs the 1-bit digital signal depending on the clock signal, and the pulse density is a rate of the number of output clock cycles for outputting the 1-bit digital signals depending on a high level output of the integrating unit, out of the number of operation period clock cycles as an operation period of the DC—DC converter.

5. The control circuit of the DC—DC converter of the switching regulator system according to claim 4,
   wherein the PWM unit includes a first counter for counting the number of times of output of the 1-bit digital data depending on the high level output of the integrating unit, a second counter for counting the number of times of repetition of the operation period clock cycles, a register for acquiring the count number of the first counter in each of the operation period depending on the count number of the second counter, and a count number comparator for comparing the count number of the second counter with the count number of the first counter held in the register, and the main switching element is controlled to conduct in the period when the count number of the second counter is smaller than the count number of the first counter, and the main switching element is controlled not to conduct in the period when the count number of the second counter is larger than the count number of the first counter.

6. A DC—DC converter of a switching regulator system comprising:
   the control circuit of the DC—DC converter as set forth in claim 1;
   a main switching element and a synchronous rectifying switching element of which the on-duty is controlled by the control circuit of the DC—DC converter; and
   a choke coil.

7. A control method of a DC—DC converter of a switching regulator system for generating an output voltage from an input voltage depending on a reference voltage, comprising:
   a step of outputting a differential signal of the output voltage and the feedback signal;
   a step of outputting a integral signal by integrating the differential signal;
   a step of outputting a 1-bit digital signal by quantizing the integral signal;
   a step of outputting the input voltage or the grounding voltage as the feedback signal depending on the input 1-bit digital signal; and
   a step of determining the on-duty of the main switching element of the DC—DC converter depending on the pulse density of the feedback signal.

* * * * *